United States Patent
Nakatsu et al.

(10) Patent No.: US 6,513,147 B1
(45) Date of Patent: Jan. 28, 2003

(54) SEMICONDUCTOR INTEGRATED CIRCUIT DEVICE AND LAYOUT METHOD USING PRIMITIVE CELLS HAVING INDENTICAL CORE DESIGNS

(75) Inventors: Isao Nakatsu, Kanagawa (JP); Atsuko Kozai, Kanagawa (JP)

(73) Assignee: NEC Corporation, Tokyo (JP)

( * ) Notice: Subject to any disclaimer, the term of this patent is extended or adjusted under 35 U.S.C. 154(b) by 219 days.

(21) Appl. No.: 09/588,458

(22) Filed: Jun. 6, 2000

(30) Foreign Application Priority Data

Jun. 18, 1999 (JP) .......................................... 11-171821

(51) Int. Cl.$^7$ .............................................. G06F 17/50
(52) U.S. Cl. .............................................. 716/8; 716/12
(58) Field of Search .................................. 716/8–14, 2

(56) References Cited

U.S. PATENT DOCUMENTS

| | | | | |
|---|---|---|---|---|
| 5,063,430 A | * | 11/1991 | Mori ........................... 357/45 |
| 5,763,907 A | * | 6/1998 | Dallavalle et al. .......... 257/202 |
| 5,880,493 A | | 3/1999 | Hidaka ....................... 257/210 |
| 5,929,469 A | * | 7/1999 | Mimoto et al. ............. 257/208 |
| 6,054,872 A | * | 4/2000 | Fudanuki et al. ........... 326/39 |
| 6,058,257 A | * | 5/2000 | Nojima ................... 395/500.13 |
| 6,253,357 B1 | * | 6/2001 | Takanashi ..................... 716/5 |
| 6,307,222 B1 | * | 10/2001 | Brunolli et al. ............. 257/207 |
| 6,327,694 B1 | * | 12/2001 | Kanzawa ....................... 716/7 |
| 6,340,825 B1 | * | 1/2002 | Shibata et al. .............. 257/207 |

FOREIGN PATENT DOCUMENTS

| | | |
|---|---|---|
| EP | 0 405 460 A2 | 2/1991 |
| JP | 6-85062 | 3/1994 |
| JP | 6-169016 | 6/1994 |

* cited by examiner

*Primary Examiner*—Vuthe Siek
(74) *Attorney, Agent, or Firm*—Choate, Hall & Stewart

(57) ABSTRACT

The present invention provides a semiconductor integrated circuit device, a layout design method and apparatus thereof which enable to select an arbitrary number of grids in primitive cells and minimize the layout area. Each primitive cell is constituted by a core portion having a circuit for realizing a function inherent to the primitive cell and a power supply wiring portion for electrical connection between the core portion and a power supply wiring and electrical connection between cores of different primitive cells. A primitive cell small group is prepared from a plurality of primitive cells having an identical core portion and different numbers of allocatable signal lines in the power supply wiring portion, so that a primitive cell having an appropriate number of signal lines as the power supply wiring portion is selected for layout.

11 Claims, 6 Drawing Sheets

BASIC STRUCTURE

EXAMPLE

SEMICONDUCTOR INTEGRATED CIRCUIT DEVICE AND LAYOUT METHOD USING PRIMITIVE CELLS HAVING INDENTICAL CORE DESIGNS

BACKGROUND OF THE INVENTION

1. Field of the Invention

The present invention relates to a semiconductor integrated circuit layout method and apparatus as well as a semiconductor integrated circuit and in particular, to a layout method and apparatus using a primitive cell.

2. Description of the Related Art

In a semiconductor integrated circuit layout design using primitive cells, among basic (minimum) cells (called 'Primitive cells') constituting transistors and logical gates, primitive cells having required functions are selected and electrically connected to one another to design a semiconductor integrated circuit layout. This layout design is performed by using a computer or the like.

FIG. 5 shows a layout example of a layout design using primitive cells (also called 'standard cells').

As shown in FIG. 5, the primitive cells have no region for arranging a signal line (called 'inter-cell signal line') for electrical connection between core portions of the primitive cells. The inter-cell signal line for electrical connection between the primitive cells is wired in a wiring region between rows where the primitive cells are arranged.

In an ordinary semiconductor integrated circuit, because of its configuration, the inter-cell signal line intersects a power source wiring, and the wiring for an inter-cell signal line and wiring for a power source are performed over a plurality of layers. A contact is arranged for a connection point of the wiring performed over a plurality of layers.

The inter-cell connection signal line electrically connecting primitive cells is arranged over a plurality of layers, requiring a contact. Accordingly, the inter-cell connection signal line arrangement is restricted, increasing the wiring region area. As a result, it has been impossible to reduce the entire layout area of a semiconductor integrated circuit.

That is, in order to reduce the layout area and increase the element density, it is necessary to reduce the wiring region area. For example, Japanese Patent Publication 6-169016 discloses a primitive cell type layout design method for reducing the semiconductor integration degree. As shown in FIG. 6(a) and in FIG. 6(b), among a plurality of primitive cells, a first and a second primitive cell each having a logic portion to be electrically connected to each other, have a wiring region for electrical connection between the logic portions and the power source.

However, in the layout method disclosed in the aforementioned publication, there is only a single arrangement of inter-cell connection signal lines, i.e., there is only one selection of the number of grids. Accordingly, it is impossible to optimize the number of grids of primitive cells according to a target circuit. As a result, it is impossible to minimize the layout area.

SUMMARY OF THE INVENTION

It is therefore an object of the present invention to provide a semiconductor integrated circuit device enabling selection of primitive cell groups having different numbers of grids so as to minimize the layout are, and a layout design method and a layout design apparatus.

The semiconductor integrated circuit device according to the present invention includes a plurality of primitive cells connected electrically, each primitive cell being constituted by a core portion having an electric circuit for realizing a function inherent to the primitive cell and a power supply wiring portion for electrical connection between the core portion and a predetermined power supply wiring and between different primitive cells, wherein the power supply wiring portion has such a configuration that an optimal number of wires is selected for electrical connection between core portions of respective primitive cells.

Moreover, the layout method of a semiconductor integrated circuit according to the present invention is a layout method of a semiconductor integrated circuit including primitive cells, each constituted by a core portion having an electric circuit for realizing a function inherent to the primitive cell and a power supply wiring portion for electrical connection between the core portion and a predetermined power supply wiring and between different primitive cells, said layout method comprising steps of:

storing in a storage unit a plurality of primitive cells having an identical core function and different number of inter-cell signal lines are defined as a primitive cell small group, and selecting and allocating a primitive cell having an appropriate number of inter-cell signal lines allocatable as a power supply wiring portion

DESCRIPTION OF THE PREFERRED EMBODIMENTS

Description will now be directed to embodiments of the present invention with reference to the attached drawings. In this invention, arrangement of inter-cell signal line for electrical connection between each of primitive cell is also present inside a primitive cell.

In this embodiment, a set of primitive cells includes a plurality of primitive cells having an identical function but having different number of grids, i.e., the maximum number of inter-cell signal lines which can be arranged, so that a primitive cell having an appropriate number of grids can be selected according to a particular purpose.

Figure 1:
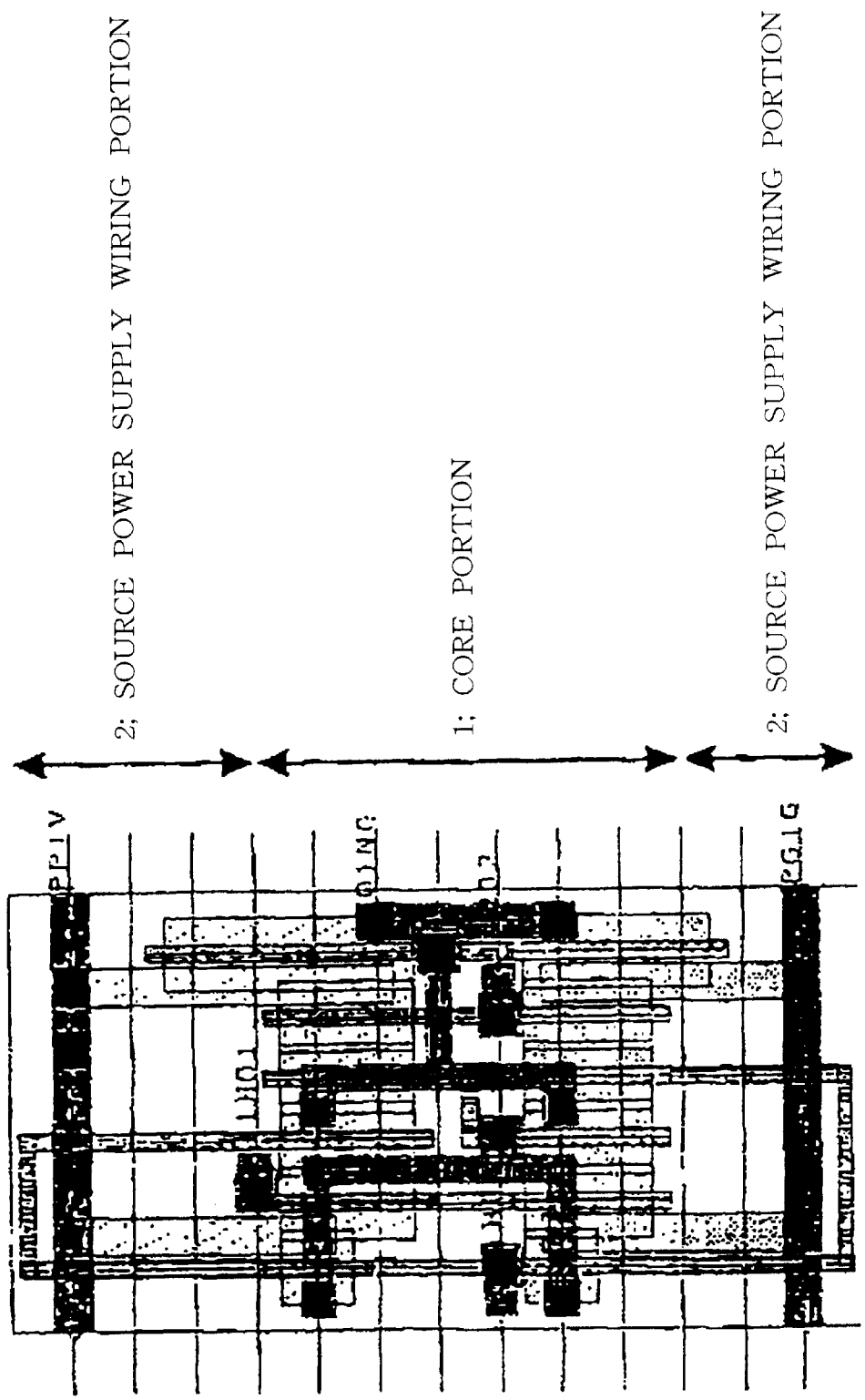
FIG. 1 shows a basic configuration of a primitive cell according to an embodiment of the present invention.

FIG. 1 shows a basic configuration of a primitive cell. The primitive cell includes a core portion 1 constituting an electric circuit by a transistor or the like and a source power supply wiring portion 2 where a power supply wiring and an inter-cell signal line are arranged. The core portion 1 is a circuit realizing a logic function of the primitive cell. If the core is identical, the function is also identical. Moreover, the core portion 1 has a wiring area for wiring an inter-cell signal line.

The source power supply wiring portion 2 is an area for wiring a power supply and an inter-cell signal line. The core portion 1 is sandwiched from top and bottom in the figure by the upper and lower parts of the source power supply wiring portion 2. The upper part supplies power to a source terminal of a p-channel MOS transistor of a high voltage power supply side, and the lower part supplies power to a source terminal of n-channel MOS transistor of a low voltage power supply side.

The number of grids in a primitive cell is determined by a configuration and a total area of the region in the core portion 1 and the source power supply wiring portion 2 where an inter-cell signal line can be arranged.

According to the present embodiment, for the same core, a plurality of primitive cells having different number of grids are prepared. Primitive cores having the same core but different number of grids constitute a small group of primitive cells.

According to the layout method of the present invention, by selecting a primitive sell having an optimal number of grids from each of primitive cell small groups, it is possible to increase the wiring efficiency of the inter-cell signal line, which in turn reduces the wiring channel region to minimize the layout area.

In the layout apparatus according to a preferred embodiment, a primitive cell includes a core portion having a circuit for realizing a function inherent to the primitive cell and a power supply wiring portion having a region for arranging an inter-cell signal line for connecting the core portion to a power supply wiring and connecting between primitive cells. Primitive cells having an identical core portion and different power supply wiring portions, i.e., different number of allocatable inter-cell signal lines are collected into a primitive cell small group. A primitive cell group consisting of plurality of primitive cell small groups is stored as a cell library in a storage unit provided in the layout apparatus, so that an automatic allocation-wiring unit selects and allocates a primitive sell having an appropriate number of signal lines allocatable as a power supply portion, from each of the primitive cell small groups and performs wiring.

In the present invention, a plurality of numbers (values) of allocatable signal lines are assumed as a power supply wiring portion of the primitive cell. Primitive cells corresponding to the respective assumed values of the signal lines are selected from the primitive cell small group by the automatic allocation-wiring unit. The layout apparatus includes a controller for performing layout for the assumed values and a layout determining unit for introducing a layout using primitive cells which minimizes the layout area among the layout results.

In this invention, primitive cells arranged adjacent to each other along a row may share a power supply wiring.

In this invention, the selection of a primitive cell having an allocatable number of signal lines as a power supply wiring portion from a primitive cell small group and its allocation and wiring process are realized by a program executed in a design support apparatus. In this invention, the control process of layout of primitive cells selected from a primitive cell small group and the layout determination process for determining a layout using primitive cells which minimizes the layout area are realized by a program executed in a design support apparatus. In this case, the program is read from a storage medium containing the program or from a communication medium for transmitting the program and loaded in a main storage of a computer so as to be executed.

EXAMPLES

Explanation will be given on some examples with reference to the attached drawings. FIG. 1 shows a layout of a primitive cell as an example. The primitive cell has a core portion 1 where an electric circuit is constituted by transistors and signal wiring and a source power supply portion 2 where the core portion 1 is electrically connected to a power supply line and other primitive cells, or other primitive cells are electrically connected to each other, i.e., an inter-cell connection line is provided.

The core portion 1 has a circuit for realizing a desired function of the primitive cell and substantially determines the operation function of the primitive cell. That is, if core portions of primitive cells are identical, the primitive cells have identical operation function. The core portion 1 can also contain an inter-cell connection line.

The source power supply wiring portion 2 is a region for a power supply wiring and an inter-cell connection signal line. The number of grids is determined by the configuration of source power supply wiring portion 2.

Figure 2:
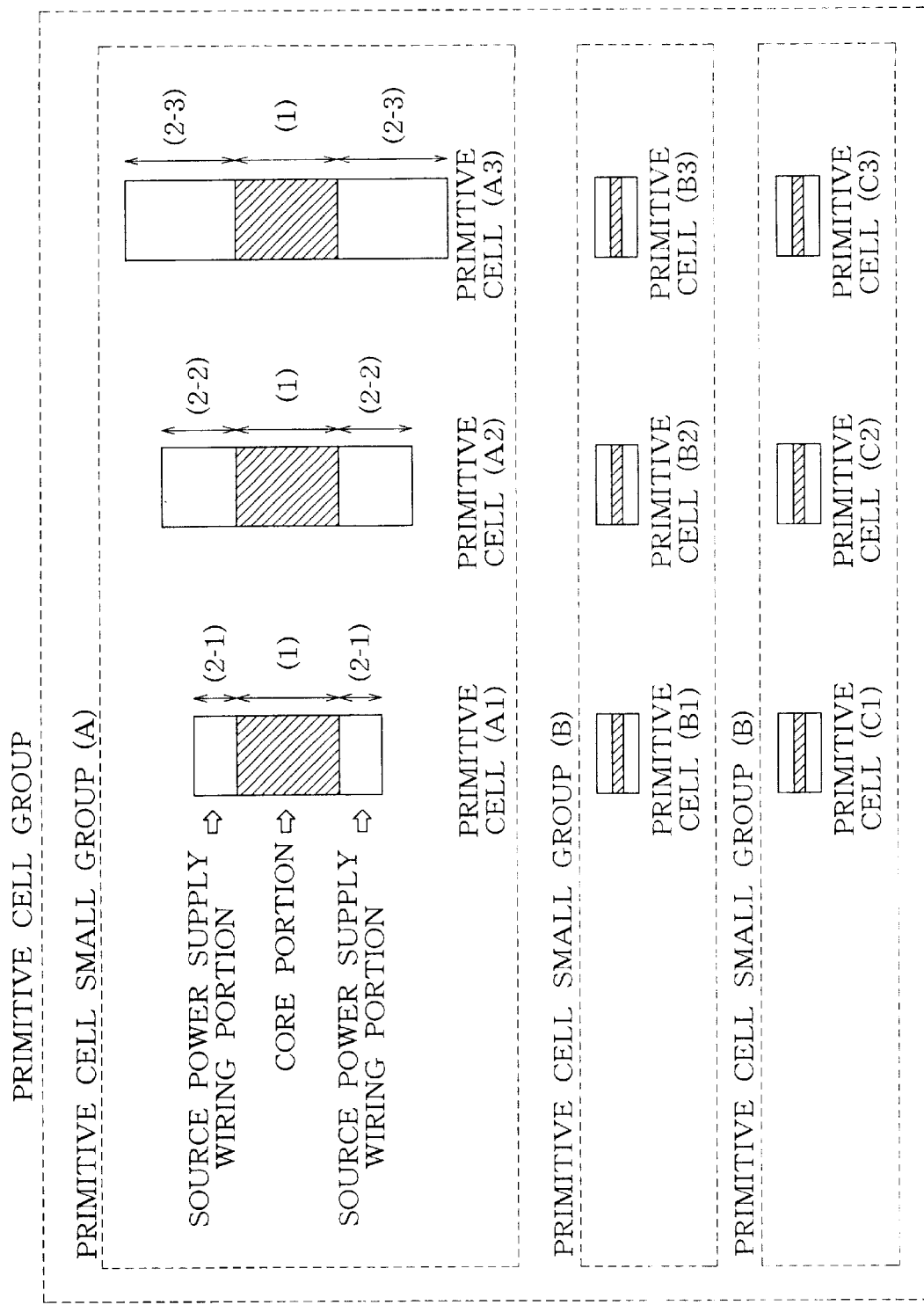
FIG. 2 shows configuration examples of primitive cells according to an embodiment of the present invention.

FIG. 2 schematically shows an example of a primitive cell group. The primitive cell group is divided into primitive cell small groups A, B, and C.

For example, the primitive cell small group A consists of a plurality of primitive cells having an identical operation function and different numbers of grids.

The primitive cells A1, A2, and A3 constituting the primitive cell small group A have identical core portion 1 and source power supply portions 2-1, 2-2, 2-3 have different configurations.

Each primitive cell group consists of an arbitrary number of primitive cell small groups and each primitive cell small group consists of an arbitrary number of primitive cells.

From a primitive cell group, primitive cells having an arbitrary number of grids are selected to be allocated and wired. This is repeated for a plurality of times. From these layout results, the minimum layout is selected.

An explanation will be given on operation of an example of the present invention. In this example, it is assumed that a primitive cell to be pre-selected has m grids and layout is performed by using only cells having m grids in the primitive cell group.

The layout design performs cell allocation and wiring by using primitive cells having m grids.

It is assumed that the resultant layout area is M.

Next, the number of grids is specified to be n and as has been described above, layout is performed by using primitive cells having n grids. This layout area is assumed to be N.

Here, the layout area M is compared to the layout area N. From this comparison, a smaller one is stored as a selected data. This comparison result is also used to set the number of grids for the next primitive cell selection.

Subsequently, layout is performed by varying the number of grids of primitive cells and the resultant area is compared to the data stored.

Thus, layout is repeated and it is found that the layout area cannot be less than a certain value.

This value is the minimum value of the layout area and the data stored with this value is set as the final layout data.

Figure 3:
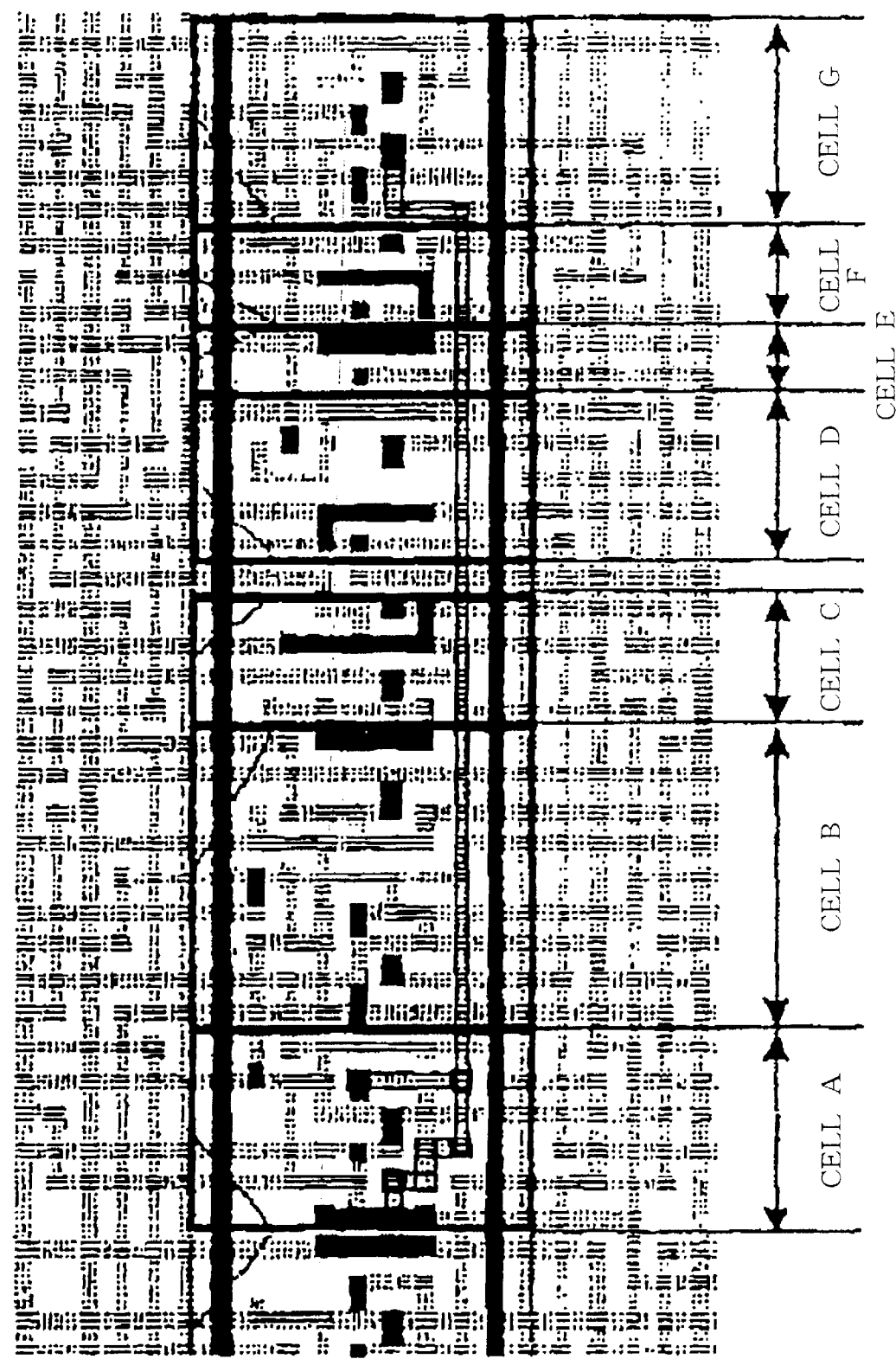
FIG. 3 shows a layout result of an embodiment of the present invention.

FIG. 3 shows a layout result of an example of the present invention. An inter-cell connection signal line between cell A and cell G is arranged in the source power supply wiring portions of primitive cells.

Thus, the inter-cell connection signal line need not intersect the power supply wiring of primitive cells, reducing the number of wires over a plurality of layers and the number of contacts. A wiring over a plurality of layers and a contact adversely affect the arrangement of the other inter-cell connection signal line. By reducing the number of wires over a plurality of the layers and the number of contacts, it is possible to reduce the layout area used for wiring.

Moreover, according to the present invention, it is possible to select an arbitrary number of grids of primitive cells and accordingly, it is possible to prevent increase of the source power supply wiring portion of primitive cells more than necessary and minimize the layout area.

Figure 4:
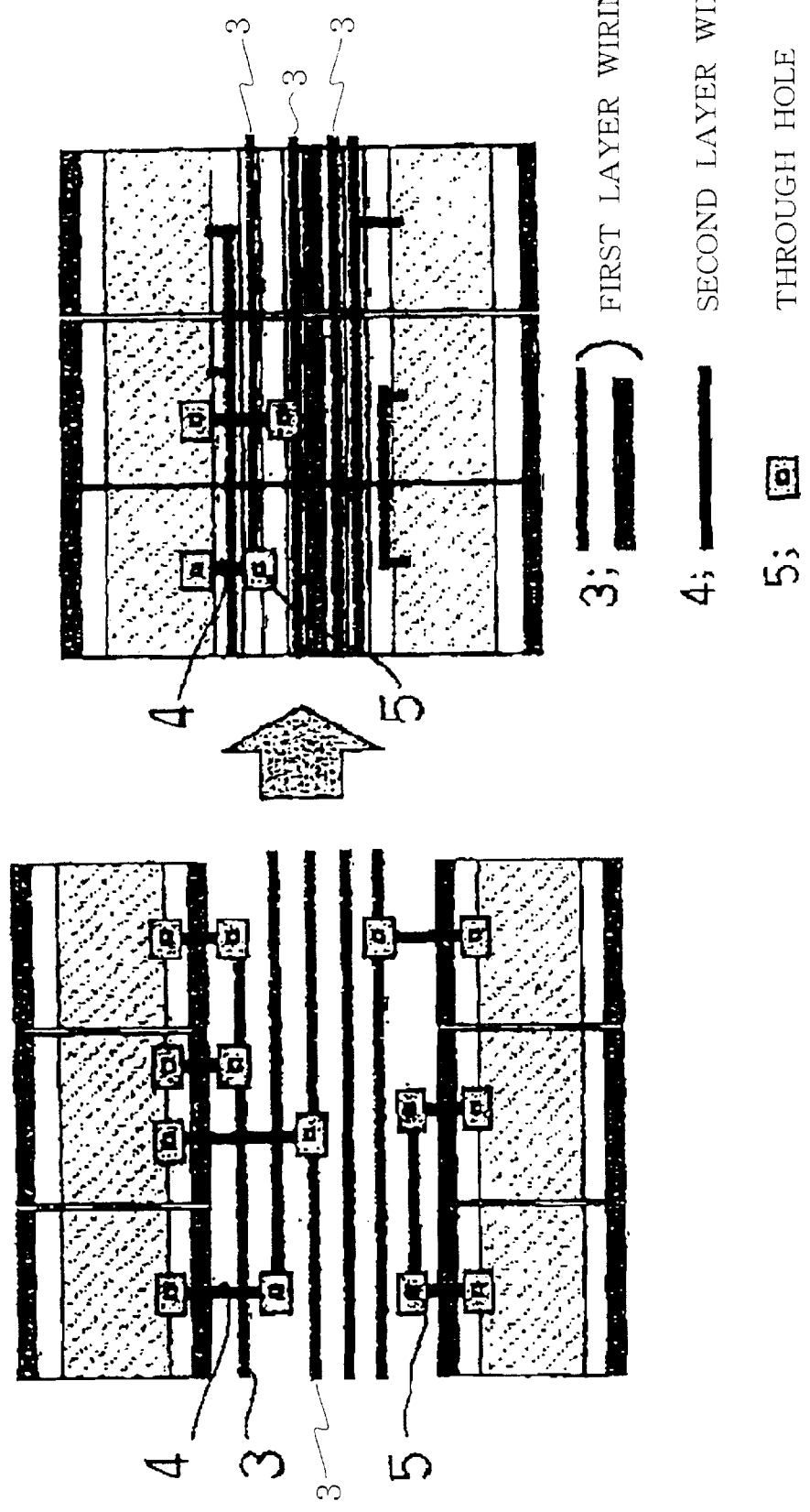
FIG. 4 explains another embodiment of the present invention.
Figure 5:
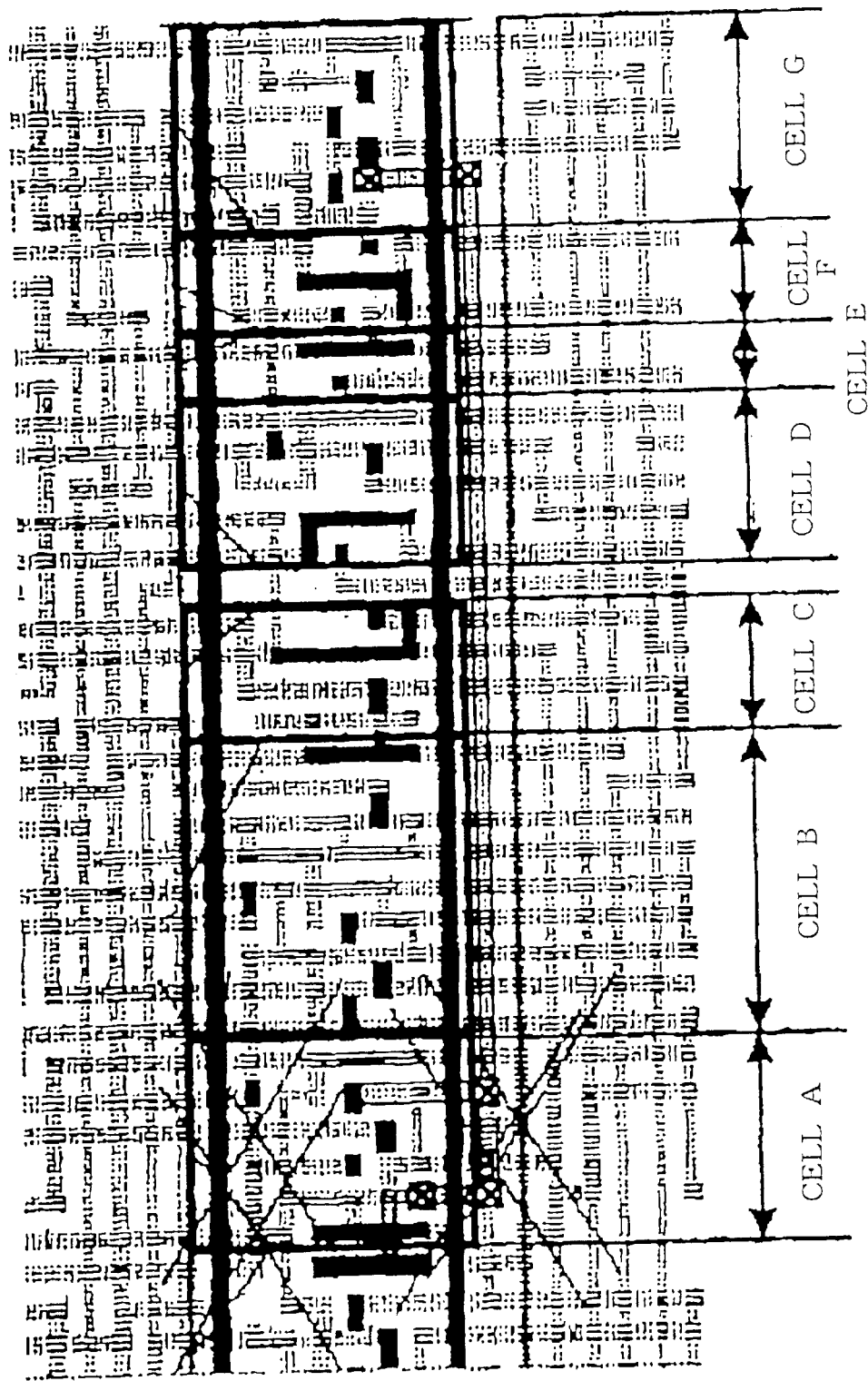
FIG. 5 shows a layout result using conventional primitive cells.
Figures 6A, 6B:
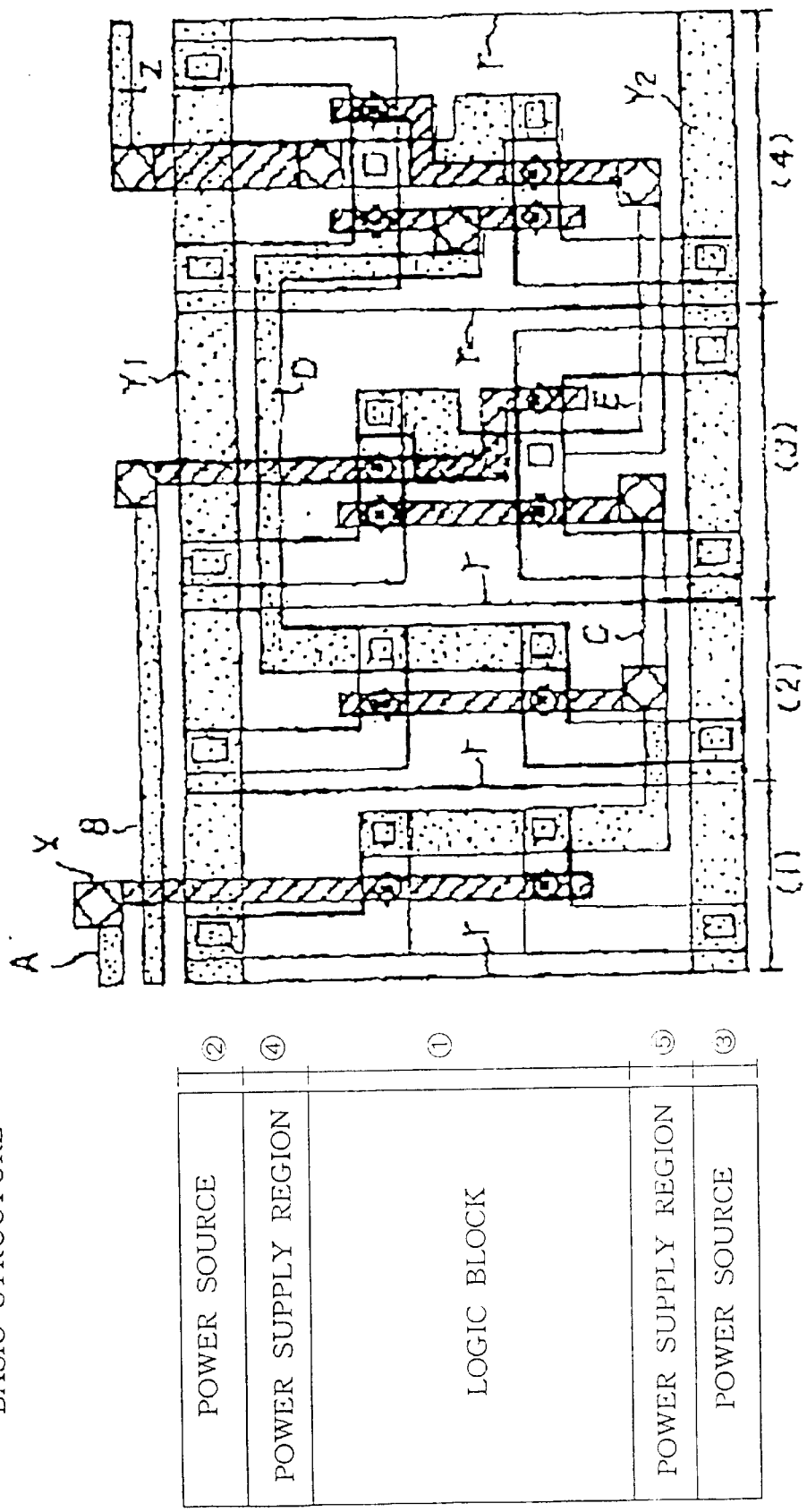
FIG. 6(a) and FIG. 6(b) shows a layout configuration cited from Japanese Patent Publication 6-169016.

Next, explanation will be given on a second example of the present invention. FIG. 4 shows the second example of the present invention.

In the second example of the present invention, a power supply wiring is shared by primitive cells adjacent to each other along a row.

In this invention, an inter-cell connection signal line can be allocated in the source power supply wiring portion of a primitive cell and accordingly, all the inter-cell connection signal lines are allocated in the source power supply wiring portions, and power supply wiring allocated for each row are shared.

In this example, by reducing the number of power supply wires, it is possible to reduce the number of intersecting points between the inter-cell connection signal lines and the power supply lines, which in turn reduces the number of arrangements of inter-cell connection signal lines over a plurality of layers and the number of contacts.

Moreover, it is possible to delete an area of one power supply wiring between rows. This also reduces the layout area.

As has been described above, according to the present invention, by preparing a plurality of combinations of source power supply portions for each core portion, so as to constitute a primitive cell small group having an identical function and different number of grids, it is possible to select primitive cells having an optimal number of wires within each primitive cell, thus increasing the wiring efficiency of each inter-cell connection signal line, reducing the wiring channel area, and reducing the layout area.

The invention may be embodied in other specific forms without departing from the spirit or essential characteristic thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. 11-171821 (Filed on Jun. 18$^{th}$, 1999) including specification, claims, drawings and summary are incorporated herein by reference in its entirety.

What is claimed is:

1. A semiconductor integrated circuit device having a plurality of primitive cells connected electrically, wherein each primitive cell is constituted by a core portion having an electric circuit for realizing a function inherent to the primitive cell and a power supply wiring portion for electrical connection between the core portion and a predetermined power supply wiring and between different primitive cells; and the power supply wiring portion has a predetermined number of wires for electrical connection between core portions of respective ones of the plurality of primitive cells.

2. A semiconductor integrated circuit device as claimed in claim 1, wherein the power supply wiring is common to a plurality of adjacent ones of the plurality of primitive cells.

3. A semiconductor integrated circuit device as claimed in claim 2, wherein the plurality of primitive cells are arranged in a row direction and the power supply wiring is shared by the plurality of primitive cells arranged in two adjacent rows.

4. A layout method of a semiconductor integrated circuit comprising primitive cells, each primitive cell constituted by a core portion having an electric circuit for realizing a function inherent to the primitive cell and a power supply wiring portion for electrical connection between the core portion and a predetermined power supply wiring and between different primitive cells, said layout method comprising the steps of:

storing in a storage unit a plurality of primitive cells, each cell having an identical core function and different number of inter-cell signal lines, the stored plurality of primitive cells defined as a primitive cell small group, and selecting from the primitive cell small group and allocating a primitive cell having a predetermined number of inter-cell signal lines allocatable as a power supply wiring portion.

5. A layout method of a semiconductor integrated circuit as claimed in claim 4, the method further comprising steps of:

setting a plurality of different values of the number of inter-cell signal lines allocatable as the power supply wiring portion, selecting a primitive cell corresponding to the set value from the primitive cell small group for temporary layout process, and performing this temporary layout process for each one of the set values, and calculating areas of each one of a plurality of semiconductor integrated circuit layouts obtained by the temporary layout processes, and selecting a layout which has a minimum area.

6. A layout method of a semiconductor integrated circuit as claimed in claim 5, wherein the plurality of primitive cells are arranged in a row direction and the power supply wiring is shared by primitive cells arranged in two adjacent rows.

7. A primitive cell type semiconductor integrated circuit layout apparatus, wherein each cell is constituted by a core portion having an electric circuit for realizing a function inherent to the primitive cell and a power supply wiring portion for electrical connection between the core portion and a predetermined power supply wiring and between different primitive cells; and an inter-cell signal line connecting core portions of different primitive cells is arranged in the power supply wiring portion, the apparatus comprising:

a cell storage unit for storing as a cell library a plurality of primitive cell small groups, each small group consisting of a plurality of primitive cells having an identical core portion and different numbers of inter-cell signal lines, and an allocating-wiring unit for selecting from a selected one of the plurality of the primitive cell small groups, a primitive cell having a preselected number of inter-cell signal lines allocatable as a power supply wiring portion and allocating and wiring the selected primitive cell.

8. A primitive cell type semiconductor integrated circuit layout apparatus as claimed in claim 7, the apparatus further comprising:

a setting unit for setting a plurality of values of inter-cell signal lines allocatable as the power supply wiring portion of the primitive cell;

a layout controller for controlling the allocation-wiring unit to select primitive cells corresponding to the respective values from the primitive cell small groups so as to perform a plurality of temporary layouts; and a layout selector for calculating areas of each one of the plurality of temporary layouts and selecting a layout which has a minimum area.

9. A primitive cell type semiconductor integrated circuit layout apparatus as claimed in claim 8, wherein the primitive cells are arranged in a row direction and the power supply wiring is shared by primitive cells in two adjacent rows.

10. A design support apparatus for performing layout of a primitive cell type semiconductor integrated circuit, wherein each primitive cell is constituted by a core portion having an electric circuit for realizing a function inherent to the primitive cell and a power supply wiring portion for electrical connection between the core portion and a predetermined power supply wiring and between different primitive cells;

the power supply wiring portion is constituted by an inter-cell signal line for electrical connection between the cores of primitive cells;

the apparatus comprising:

a cell storage unit for storing a cell library including a plurality of primitive cell small groups, each small group consisting of primitive cells having an identical core function and different numbers of inter-cell signal lines; and a recording medium containing a program for selecting, allocating, and wiring primitive cells having a predetermined number of inter-cell signal lines allocatable as the power supply wiring portion, on a computer constituting the design support apparatus.

11. A recording medium containing a program to be executed by a computer constituting a design support apparatus for performing layout of a primitive cell type semiconductor integrated circuit, wherein each primitive cell is constituted by a core portion having an electric circuit for realizing a function inherent to the primitive cell and a power supply wiring portion for electrical connection between the core portion of the primitive cell and a predetermined power supply wiring and between different primitive cells;

the design support apparatus comprises a storage unit for containing as a cell library a primitive cell group consisting of primitive cell small groups, each small group including a plurality of primitive cells having an identical core portion and different numbers of inter-cell signal lines for electrically connecting core portions of different primitive cells;

the program causes the computer to set a plurality of different values of the number of inter-cell signal lines allocatable as power supply wiring portions in the primitive cells and to perform:

(a) a layout process for selecting primitive cells corresponding to the respective set values from the primitive cell small groups, (b) a layout control process for repeating the layout process of (a) for each of the set values, and (c) layout selection process for selecting a layout having a minimum area among a plurality of layout results.

* * * * *